United States Patent
Matsunaga et al.

(10) Patent No.: US 6,838,853 B2
(45) Date of Patent: Jan. 4, 2005

(54) STEPPING MOTOR DRIVE DEVICE AND METHOD

(75) Inventors: Hiroki Matsunaga, Takatsuki (JP); Shingo Fukamizu, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/651,260

(22) Filed: Aug. 29, 2003

(65) Prior Publication Data

US 2004/0124804 A1 Jul. 1, 2004

(30) Foreign Application Priority Data

Dec. 27, 2002 (JP) ........................................ 2002-381355

(51) Int. Cl.[7] .............................................. G05B 19/40
(52) U.S. Cl. ....................... 318/685; 318/696; 318/599; 318/811
(58) Field of Search ................................ 318/685, 696, 318/599, 81

(56) References Cited

U.S. PATENT DOCUMENTS 6,574,520 B1 * 6/2003 Liu et al. ...................... 700/96

FOREIGN PATENT DOCUMENTS

JP          06-343295       12/1994

* cited by examiner

Primary Examiner—Karen Masih
(74) Attorney, Agent, or Firm—McDermott Will & Emery LLP

(57) ABSTRACT

A reference signal generation unit integrates a staircase signal, to produce reference signal VCTA whose waveform has no abrupt changes in level and which shows a current limit value. A PWM reference signal generation unit generates a PWM reference signal. A supply current measurement unit measures a supply current to a coil. A PWM control unit compares reference signal VCTA with the measurement value of the supply current measurement unit in each period of the PWM reference signal, and sets each transistor in a bridge rectification circuit in a conducting state or a nonconducting state according to the comparison result. In this way, the supply current to the coil is controlled to approach the current limit value shown by reference signal VCTA.

16 Claims, 23 Drawing Sheets

STEPPING MOTOR DRIVE DEVICE AND METHOD

This application is based on an application No. 2002-381355 filed in Japan, the contents of which are hereby incorporated by reference.

BACKGROUND OF THE INVENTION

1. Field of the Invention

The present invention relates to a stepping motor drive device, and in particular relates to techniques of driving a stepping motor with low noise and low vibration.

2. Related Art

In recent years, stepping motors are used in photographing electronics devices, such as a DSC (Digital Still Camera) and a DVC (Digital Video Camera), as optical system actuators for adjustment of aperture, focus, zoom, and the like.

Stepping motors, especially those used for photographing electronics devices, are required to operate with low noise and low vibration. This is because sounds generated by a stepping motor are caught by a built-in microphone of a photographing electronics device and recorded as noise, and vibrations generated by a stepping motor cause unsteadiness of a photographing electronics device and result in a drop in picture quality.

In response to this demand, a technique of driving a stepping motor with low noise and low vibration is disclosed, for instance, by Unexamined Japanese Patent Application Publication No. H06-343295.

FIG. 23 is a drive device disclosed by this publication. The following description focuses only on components that are necessary for explaining the principle of the device.

In FIG. 23, reference numeral 20 denotes a stepping motor that is driven by the drive device. The stepping motor 20 includes a rotor 45, a first coil 19a, and a second coil 19b.

An up-down counter 43a counts up or down clock signal CLKP in accordance with up-down signal DA, and outputs 4-bit signal DA1–DA4 showing the count to a D/A converter 44a.

The D/A converter 44a outputs voltage signal VCA corresponding to 4-bit signal DA1–DA4. Voltage signal VCA is a staircase waveform that rises and falls stepwise. A rapidity of change in level of voltage signal VCA can be varied depending on a pulse frequency of clock signal CLKP and a step height of voltage signal VCA. When the pulse frequency of clock signal CLKP is higher or the step height of voltage signal VCA is greater, the rapidity of change in level of voltage signal VCA is greater. Also, by stopping clock signal CLKP, voltage signal VCA can be held at a fixed level.

A voltage drive circuit 39a amplifies voltage signal VCA by a non inverting power amplifier 41a, and also amplifies voltage signal VCA by an inverting power amplifier 42a. Thus, the voltage drive circuit 39a drives the first coil 19a which is connected between output terminals of the power amplifiers 41a and 42a, through the application of a voltage.

The same components as described above are provided for the second coil 19b too, to drive the second coil 19b through the application of a voltage based on a staircase waveform.

According to this construction, a voltage which rises stepwise at the beginning of energization and falls stepwise at the end of energization is applied to a coil. Hence vibration and noise caused by abrupt torque fluctuations can be reduced when compared with the case where a voltage which rises to a highest level in one stroke at the beginning of energization and falls in one stroke at the end of energization is applied to a coil.

Note here that though the above drive device drives each coil through the application of a voltage, the same noise and vibration suppression effect can still be achieved even when each coil is driven through the application of a current based on a staircase waveform.

The effect of this conventional drive device, however, is not sufficient to completely eliminate vibration and noise, since some vibration and noise still remain due to torque fluctuations which occur in each step-up and step-down of the staircase waveform. This is particularly problematic when stepping motors are used in photographing electronics devices. Hence a need exists for further reduction of noise and vibration in stepping motor operations.

SUMMARY OF THE INVENTION

In view of the above problem, the present invention aims to provide a device for driving a stepping motor with low noise and low vibration.

The stated object can be achieved by a stepping motor drive device including: a supply current measurement unit operable to measure a supply current to a coil included in a stepping motor; a reference signal generation unit operable to generate a reference signal of a waveform which has no abrupt changes in level, the reference signal showing a target value for the supply current; a chopper switching circuit operable to pass the supply current to the coil in a conducting state, and stop the supply current to the coil in a nonconducting state; and a pulse width modulation control unit operable to (a) put the chopper switching circuit in the conducting state at predetermined time intervals, and (b) when in each time interval the supply current measured by the supply current measurement unit rises above the target value shown by the reference signal, put the chopper switching circuit in the nonconducting state.

Here, the reference signal generation unit may include: a staircase generation unit operable to generate a staircase signal; and an integration circuit operable to generate the reference signal by integrating the staircase signal.

Here, the stepping motor drive device may further include: a bridge rectification circuit including the chopper switching circuit and a plurality of switching circuit, and operable to rectify the supply current, wherein the pulse width modulation control unit reverses a polarity of the supply current, by putting each of the chopper switching circuit and the plurality of switching circuits individually in a predetermined state that is one of the conducting state and the nonconducting state.

Here, the supply current measurement unit may include a resistor connected in series with the coil, and measure the supply current using a voltage drop of the resistor.

Here, the resister may be a semiconductor element in the conducting state.

With these constructions, the supply current is controlled to approach the target value shown by the reference signal of the waveform which has no abrupt changes in level. This has an effect of suppressing vibration and noise caused by torque fluctuations which occur in each step-up and step-down in the conventional technique that controls a supply current using a target value shown by a staircase waveform.

Here, the integration circuit may generate the reference signal which follows an average gradient of the staircase signal, by integrating the staircase signal using a time constant corresponding to a rapidity of change in level of the staircase signal.

Here, the integration circuit may acquire a rapidity signal showing the rapidity of change in level of the staircase signal, and determine the time constant according to the rapidity signal.

Here, the staircase generation unit may generate the staircase signal by counting a pulse signal which has one pulse per step of the staircase signal, wherein the stepping motor drive device further includes: a discrimination unit operable to discriminate a pulse frequency of the pulse signal, and the integration circuit determines the time constant based on a result of the discrimination by the discrimination unit.

With these constructions, the smooth reference signal which follows the staircase signal is generated according to the rapidity of change in level of the staircase signal. This makes it possible to deliver the noise and vibration suppression effect for different motor rotation speeds.

Here, the stepping motor drive device may further include: an information signal reception unit operable to receive an information signal showing a level of each step of the staircase signal, wherein the staircase generation unit generates the staircase signal, by digital-to-analog converting the received information signal in a unit of time corresponding to each step.

With this construction, the staircase signal of a desired waveform is generated based on the information signal. Especially, an excellent noise and vibration suppression effect can be exhibited through the use of a near-sinusoidal staircase waveform.

Here, the stepping motor drive device may further include: a synchronous rectification control unit operable to put at least two out of the plurality of switching circuits in the conducting state during a period when the chopper switching circuit is in the nonconducting state, to have a current in the coil flow back through the at least two switching circuits.

With this construction, an effect of accelerating current decay is obtained in addition to the noise and vibration suppression effect. This enables the coil current to approach the target value shown by the reference signal more promptly, when the reference signal decreases.

Here, the supply current measurement unit may be realized by one out of the chopper switching circuit and the plurality of switching circuits that is in the conducting state, and measure the supply current using a voltage drop caused by an ON resistance of the switching circuit in the conducting state, wherein the stepping motor drive device further include: a reference current source operable to generate a current having the target value shown by the reference signal; and a resistor connected in series with the reference current source, and the pulse width modulation control unit puts the chopper switching circuit in the conducting state at the predetermined time intervals, and when in each time interval the voltage drop of the supply current measurement unit exceeds a voltage drop of the resistor, puts the chopper switching circuit in the nonconducting state.

With this construction, the supply current is measured using the voltage drop caused by the ON resistance of the switching circuit in the bridge rectification circuit. This makes it unnecessary to insert a dedicated shunt resistor for measuring the current in the passage of the supply current. Hence the noise and vibration suppression effect can be achieved without a decrease in current supply efficiency.

Here, the resistor may be a semiconductor element in the conducting state.

With this construction, the switching circuit for measuring the current and the resistor can be realized by transistors that are manufactured in the same diffusion process and so have the same characteristics. This contributes to a higher relative precision for measuring the current.

Here, the stepping motor may have a plurality of coils which correspond one-to-one with a plurality of phases, wherein the supply current measurement unit measures the supply current for each of the plurality of coils, the reference signal generation unit generates the reference signal for each of the plurality of coils, the chopper switching circuit, for each of the plurality of coils, passes the supply current to the coil in the conducting state and stops the supply current to the coil in the nonconducting state, and the pulse width modulation control unit, for each of the plurality of coils, puts the chopper switching circuit in the conducting state at the predetermined time intervals, and when in each time interval the supply current measured by the supply current measurement unit rises above the target value shown by the reference signal, puts the chopper switching circuit in the nonconducting state.

With this construction, the supply current to each coil is controlled to approach the target value shown by the corresponding reference signal which has no abrupt changes in level. This produces the noise and vibration suppression effect.

The stated object can also be achieved by a stepping motor drive method including: a supply current measurement step of measuring a supply current to a coil included in a stepping motor; a reference signal generation step of generating a reference signal of a waveform which has no abrupt changes in level, the reference signal showing a target value for the supply current; and a pulse width modulation control step of (a) putting a chopper switching circuit which passes the supply current to the coil in a conducting state and stops the supply current to the coil in a nonconducting state, in the conducting state at predetermined time intervals, and (b) when in each time interval the supply current measured in the supply current measurement step rises above the target value shown by the reference signal, putting the chopper switching circuit in the nonconducting state.

Here, the reference signal generation step may include: a staircase generation step of generating a staircase signal; and an integration step of generating the reference signal by integrating the staircase signal.

With these methods, the noise and vibration suppression effect can be obtained.

Here, the integration step may generate the reference signal which follows an average gradient of the staircase signal, by integrating the staircase signal using a time constant corresponding to a rapidity of change in level of the staircase signal.

With this method, the noise and vibration suppression effect can be obtained for different motor rotation speeds.

BRIEF DESCRIPTION OF THE DRAWINGS

These and other objects, advantages and features of the invention will become apparent from the following description thereof taken in conjunction with the accompanying drawings which illustrate a specific embodiment of the invention.

In the drawings.

DESCRIPTION OF THE PREFERRED EMBODIMENTS

First Embodiment

A stepping motor drive device of the first embodiment of the present invention generates a reference signal whose waveform has no abrupt changes in level and which shows a current limit value. Here, a waveform which has no abrupt changes in level is a waveform represented by a continuous function. A waveform represented by a continuous function is smooth where the level changes. For example, a sinusoidal waveform and a triangular waveform and a trapezoidal waveform that rise and fall slopewise belong to this type, but a staircase waveform and a square waveform do not belong to this type.

The stepping motor drive device exercises a PWM (Pulse Width Modulation) control on a coil current, according to the current limit value shown by the reference signal. In detail, the PWM control is done using a current chopping method.

This stepping motor drive device is explained in detail below, by referring to drawings.

(Overall Construction)

Figure 1:
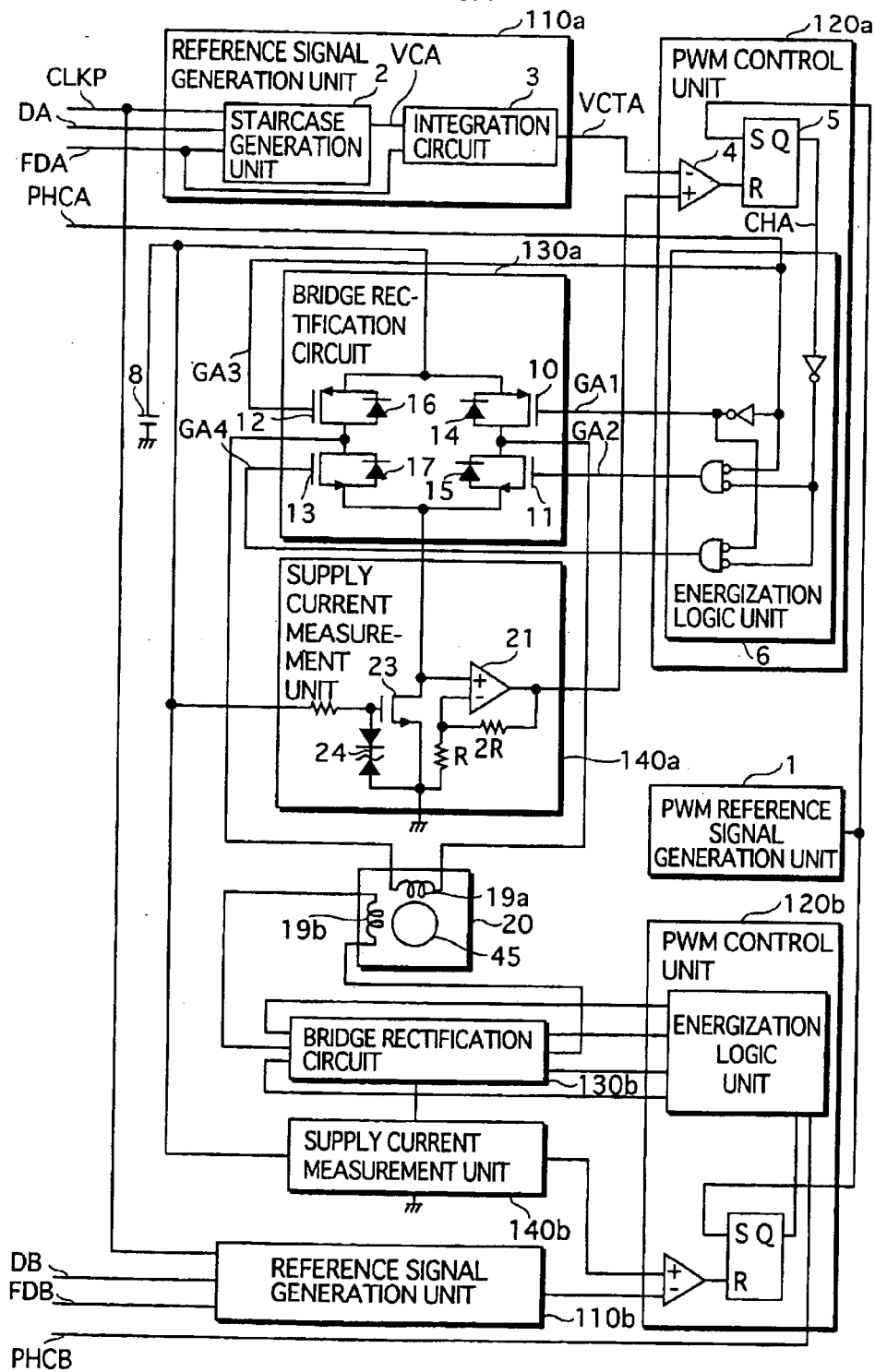
FIG. 1 is a functional block diagram showing a construction of a stepping motor drive device to which embodiments of the invention relate.

FIG. 1 is a functional block diagram showing an overall construction of the stepping motor drive device. The drawing also shows a stepping motor that is driven by the stepping motor drive device.

In FIG. 1, reference numeral 20 denotes the stepping motor. The stepping motor 20 includes the rotor 45, and the first coil 19a and the second coil 19b that correspond to different phases.

The stepping motor drive device includes a PWM reference signal generation unit 1, reference signal generation units 110a and 110b, PWM control units 120a and 120b, bridge rectification circuits 130a and 130b, supply current measurement units 140a and 140b, and a power supply 8.

Since the same components are provided for each of the first coil 19a and the second coil 19b, the components provided for the first coil 19a are explained below as a representative example.

The reference signal generation unit 110a includes a staircase generation unit 2 and an integration circuit 3. The PWM control unit 120a includes a comparator 4, a flip-flop 5, and an energization logic unit 6. The bridge rectification circuit 130a includes transistors 10 to 13 and flywheel diodes 14 to 17. Here, one of the transistors 11 and 13 that corresponds to a polarity of a supply current to the first coil 19a periodically chops the supply current, in accordance with a gate signal output from the energization logic unit 6. Which is to say, the transistor periodically repeats the supply of the current to the first coil 19a and the stop of the supply to the first coil 19a. The supply current measurement unit 140a includes an amplifier 21, a transistor 23, and an ON resistance adjustment circuit 24.

(Staircase Generation Unit 2)

Figure 2:
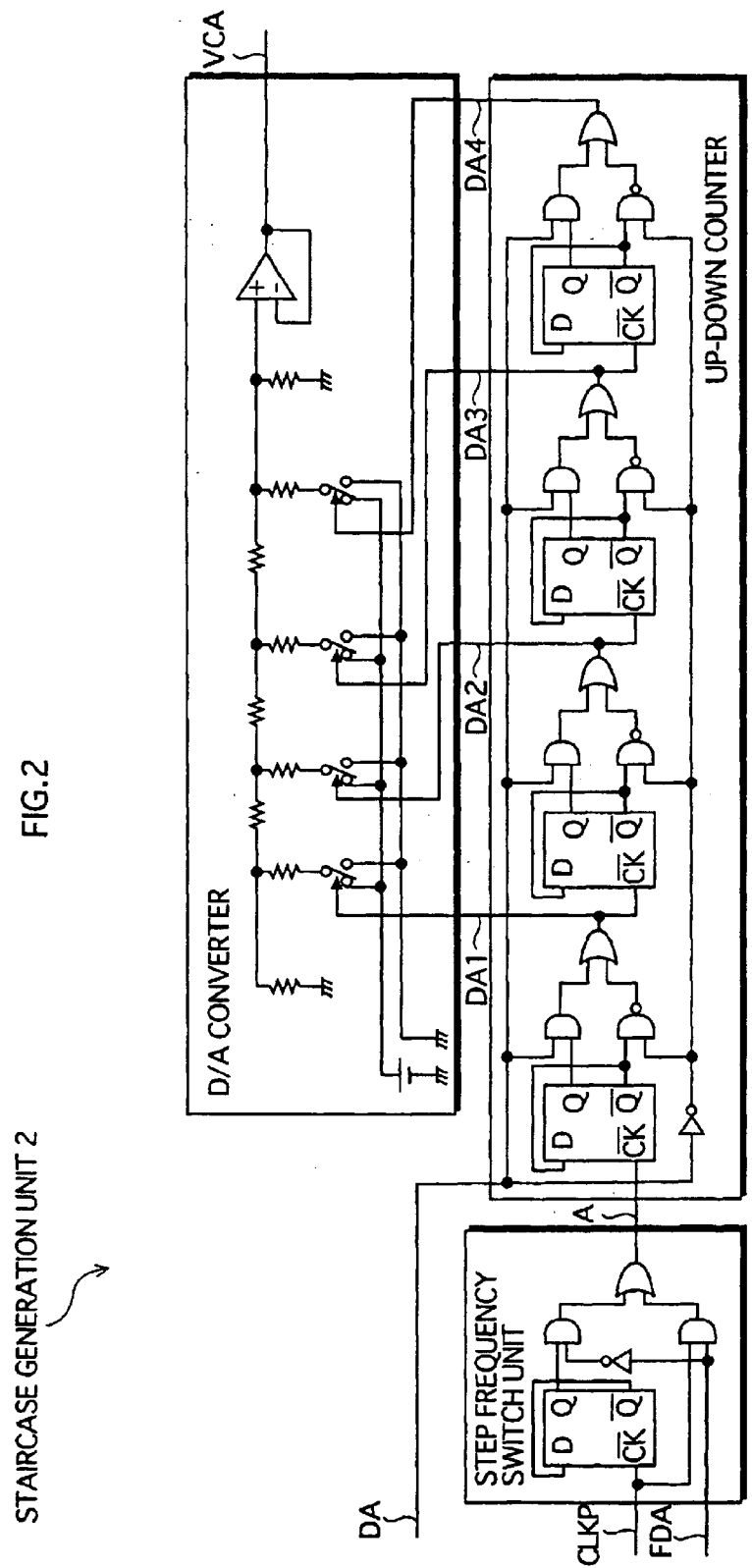
FIG. 2 is a functional block diagram showing a construction of a staircase generation unit shown in FIG. 1.

FIG. 2 is a functional block diagram showing a detailed construction of the staircase generation unit 2. A step frequency switch unit selects clock signal CLKP or a signal obtained by dividing clock signal CLKP by 2, according to step frequency signal FDA. The step frequency switch unit outputs the selected signal to an up-down counter as signal A whose cycle corresponds to each step of a staircase.

The up-down counter counts up or down signal A, according to up-down signal DA. The up-down counter outputs 4-bit signal DA1–DA4 showing the count, to a D/A converter. The D/A converter converts 4-bit signal DA1–DA4 to an analog voltage, and outputs it as staircase signal VCA.

Since the up-down counter and the D/A converter are well known in the art, their detailed explanation has been omitted here.

Figure 3:
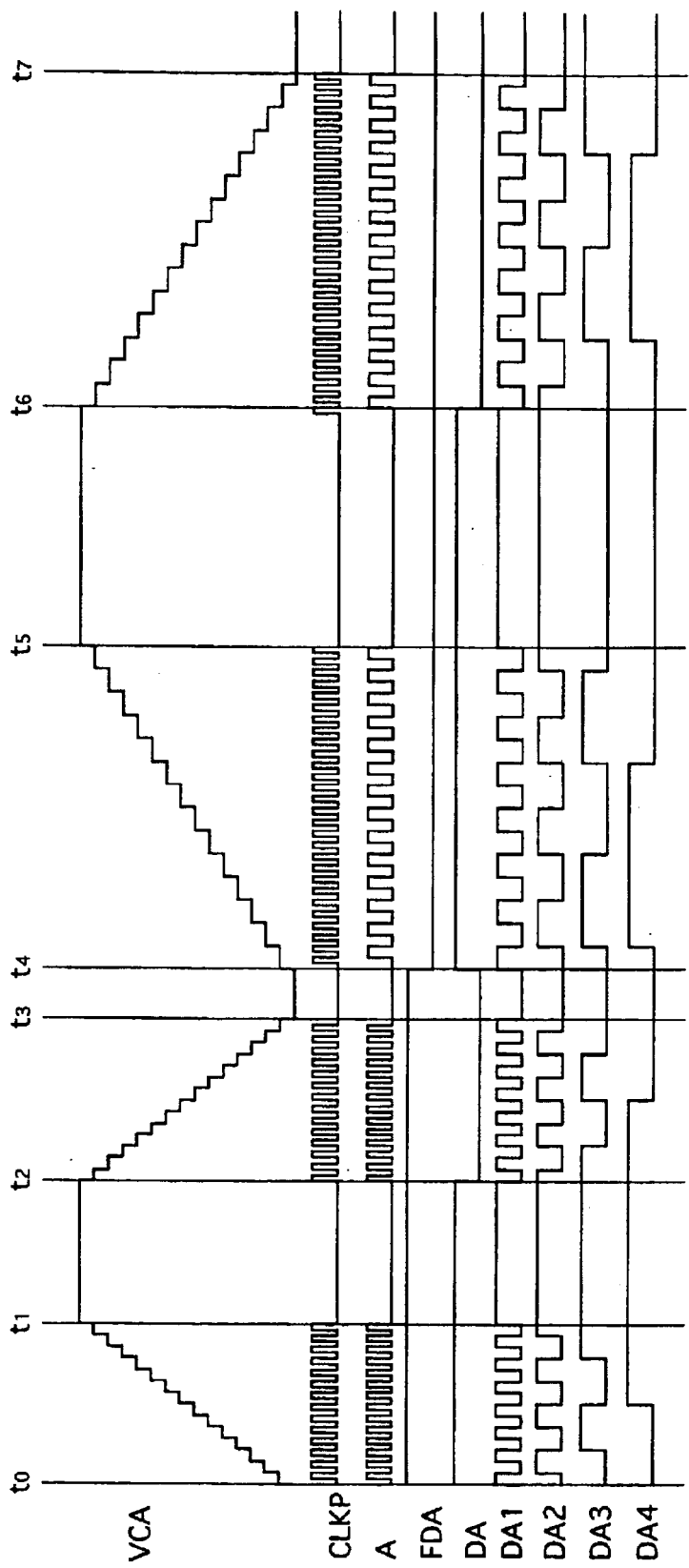
FIG. 3 is a waveform chart showing temporal changes of main signals in the staircase generation unit.

FIG. 3 is a waveform chart showing temporal changes of main signals in the staircase generation unit 2.

From t0 to t1, clock signal CLKP is given together with high step frequency signal FDA and high up-down signal DA. Accordingly, the up-down counter and the D/A converter generate staircase signal VCA that rises from a lowest level to a highest level with a high step frequency.

From t1 to t2, clock signal CLKP is stopped. Hence staircase signal VCA is held at the highest level.

From t2 to t3, clock signal CLKP is given together with high step frequency signal FDA and low up-down signal DA. Accordingly, the up-down counter and the D/A converter generate staircase signal VCA that falls from the highest level to the lowest level with the high step frequency.

From t4 to t7, step frequency signal FDA is low. Accordingly, the up-down counter and the D/A converter generate staircase signal VCA that rises and falls with a low step frequency.

(Integration Circuit 3)

Figure 4:
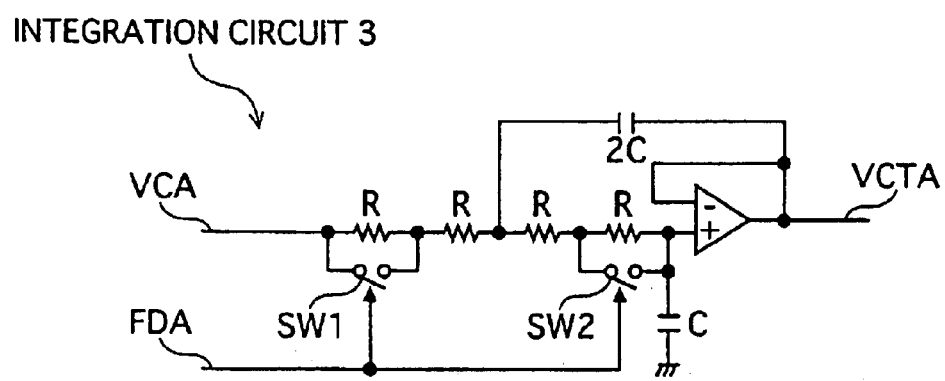
FIG. 4 is a functional block diagram showing a construction of an integration circuit shown in FIG. 1.

FIG. 4 is a circuit diagram showing a detailed construction of the integration circuit 3. This construction is well known as a Butterworth lowpass filter. The integration circuit 3 integrates staircase signal VCA using an integration time constant corresponding to step frequency signal FDA, to generate reference signal VCTA whose waveform follows an average gradient of staircase signal VCA. To do so, switches SW1 and SW2 under control of step frequency signal FDA are provided to adjust a resistance which determines an integration time constant.

Figure 5A:
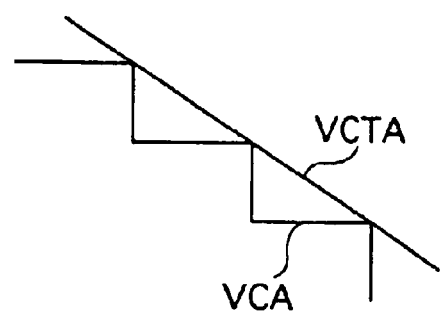
FIGS. 5A and 5B are conceptual diagrams showing reference signals which are generated using different integration time constants so as to follow staircase signals of different step frequencies.
Figure 5B:
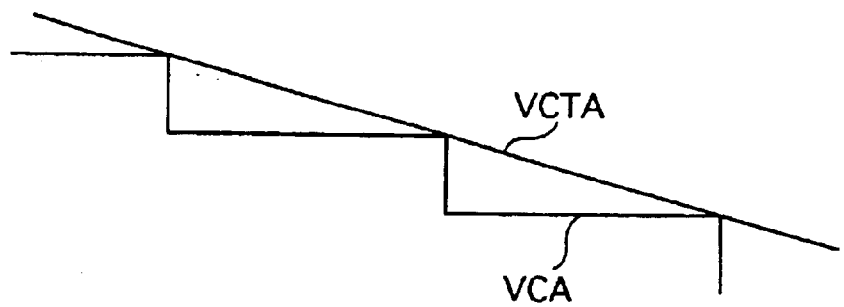

FIGS. 5A and 5B are each a conceptual diagram showing reference signal VCTA which is obtained using a different integration time constant so as to follow staircase signal VCA of a different step frequency.

When step frequency signal FDA is a high which indicates staircase signal VCA has a high step frequency, switches SW1 and SW2 are short-circuited to set a low resistance and a low integration time constant. In this case, reference signal VCTA which follows an average gradient of staircase signal VCA having the high step frequency is obtained as shown in FIG. 5A.

When step frequency signal FDA is a low which indicates staircase signal VCA has a low step frequency, switches SW1 and SW2 are opened to set a high resistance and a high integration time constant. In this case, reference signal VCTA which follows an average gradient of staircase signal VCA having the low step frequency is obtained as shown in FIG. 5B.

Reference signal VCTA obtained in this way has no abrupt changes in level. Which is to say, reference signal VCTA does not have stepwise level variations of staircase signal VCA.

(PWM Control of a Coil Current)

The following explains a coil current PWM control operation performed by the PWM reference signal generation unit 1, the PWM control unit 120a, the bridge rectification circuit 130a, and the supply current measurement unit 140a.

Figure 6:
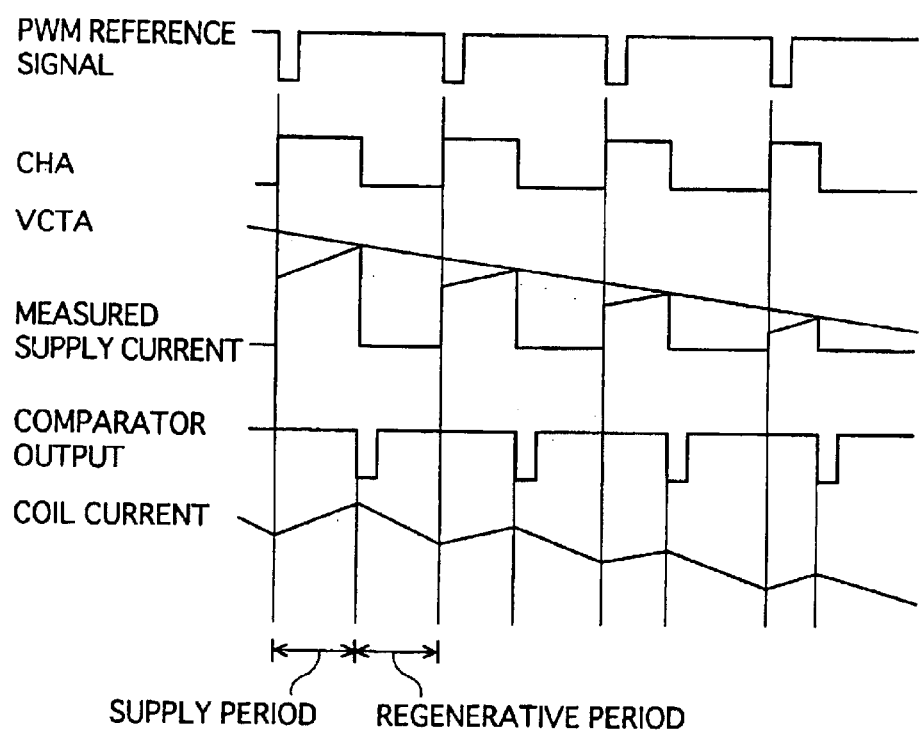
FIG. 6 is a waveform chart showing temporal changes of main signals relating to PWM control.

FIG. 6 is a waveform chart showing temporal changes of main signals relating to this PWM control operation.

Figure 7:
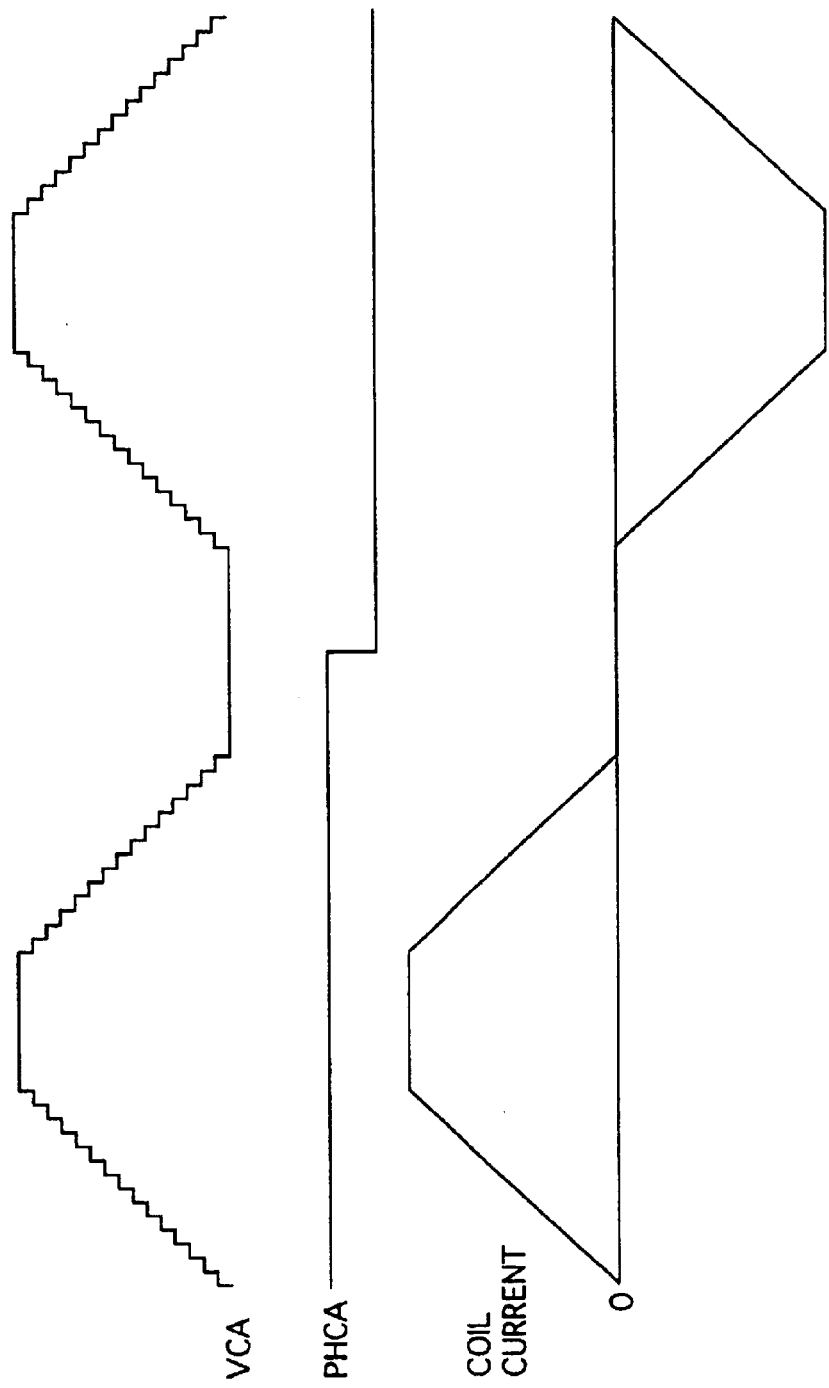
FIG. 7 is a waveform chart showing a coil current which has its polarity reversed.

FIG. 7 is a waveform chart of a coil current of the first coil 19a with its polarity reversed.

The PWM reference signal generation unit 1 generates a PWM reference signal which designates the beginning of a supply period for supplying a current to the first coil 19a, at predetermined intervals.

The flip-flop 5 is set in sync with leading edges of the PWM reference signal, and outputs supply instruction signal CHA which designates the supply period. The energization logic unit 6 outputs predetermined gate signals GA1–GA4 respectively to the transistors 10–13, according to supply instruction signal CHA and polarity signal PHCA which shows a polarity of the supply current. As a result, one of the pair of transistors 10 and 13 and the pair of transistors 12 and 11 conduct, and the other cut off. Hence the supply current of the polarity corresponding to polarity signal PHCA is fed from the power supply 8 to the first coil 19a. This supply current (i.e. the coil current in the supply period) increases gradually.

The supply current passes the transistor 23 which is adjusted at a predetermined ON resistance by the ON resistance adjustment circuit 24. Accordingly, the supply current is measured using a voltage between a drain and a source of the transistor 23. The voltage is amplified by the amplifier 21 and then input to an inverting input terminal of the comparator 4. At the same time, reference signal VCTA is input to a noninverting input terminal of the comparator 4.

When the supply current increases and the output voltage of the amplifier 21 exceeds the voltage of reference signal VCTA, the comparator 4 outputs a signal to reset the flip-flop 5. This causes supply instruction signal CHA to transition to low, and gate signals GA2 and GA4 to transition to low. As a result, the transistors 11 and 13 for current chopping are cut off. Hence the supply current to the first coil 19a is stopped.

In a regenerative period that follows, the coil current flows back through one of the pair of transistor 12 and flywheel diode 14 and the pair of transistor 10 and flywheel diode 16 according to a direction of the current, and so decreases gradually.

The above supply period and regenerative period are repeated each time the PWM reference signal is output. In this way, the coil current is controlled to approach the current limit value shown by reference signal VCTA.

As mentioned earlier, reference signal VCTA used in this embodiment does not have stepwise level variations. Accordingly, vibration and noise caused by torque fluctuations in each step-up and step-down of a staircase signal when the staircase signal is used as a reference signal are completely eliminated.

It should be noted here that the ON resistance adjustment circuit 24 and the transistor 23 in the supply current measurement unit 140a may be replaced simply by a resistor.

Also, if an increase in voltage drop between both ends of the transistor 23 (a loss of supply current) relating to supply current measurement is acceptable, the amplifier 21 may be omitted.

Second Embodiment

A stepping motor drive device of the second embodiment of the present invention differs from that of the first embodiment in the following point. Step frequency signal FDA is generated inside the device by discriminating a pulse frequency of clock signal CLKP among a plurality of pulse frequencies, and reference signal VCTA is generated using generated step frequency signal FDA. The following explanation mainly focuses on this difference from the first embodiment.

(Construction Relating to the Generation of Reference Signal VCTA)

Figure 8:
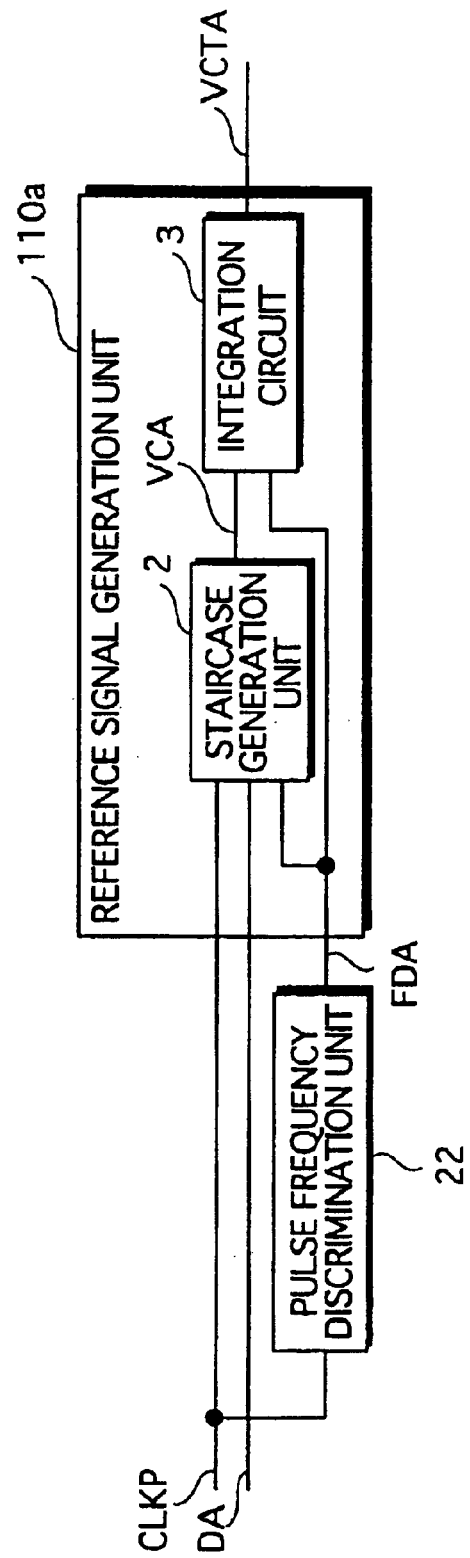
FIG. 8 is a functional block diagram showing a modification relating to reference signal generation.

FIG. 8 is a functional block diagram showing a construction relating to the generation of reference signal VCTA in the second embodiment. This construction differs from that of the first embodiment in that a pulse frequency discrimination unit 22 is added. The pulse frequency discrimination unit 22 generates step frequency signal FDA, which was acquired from outside the device in the first embodiment, by discriminating the pulse frequency of clock signal CLKP.

Figure 9:
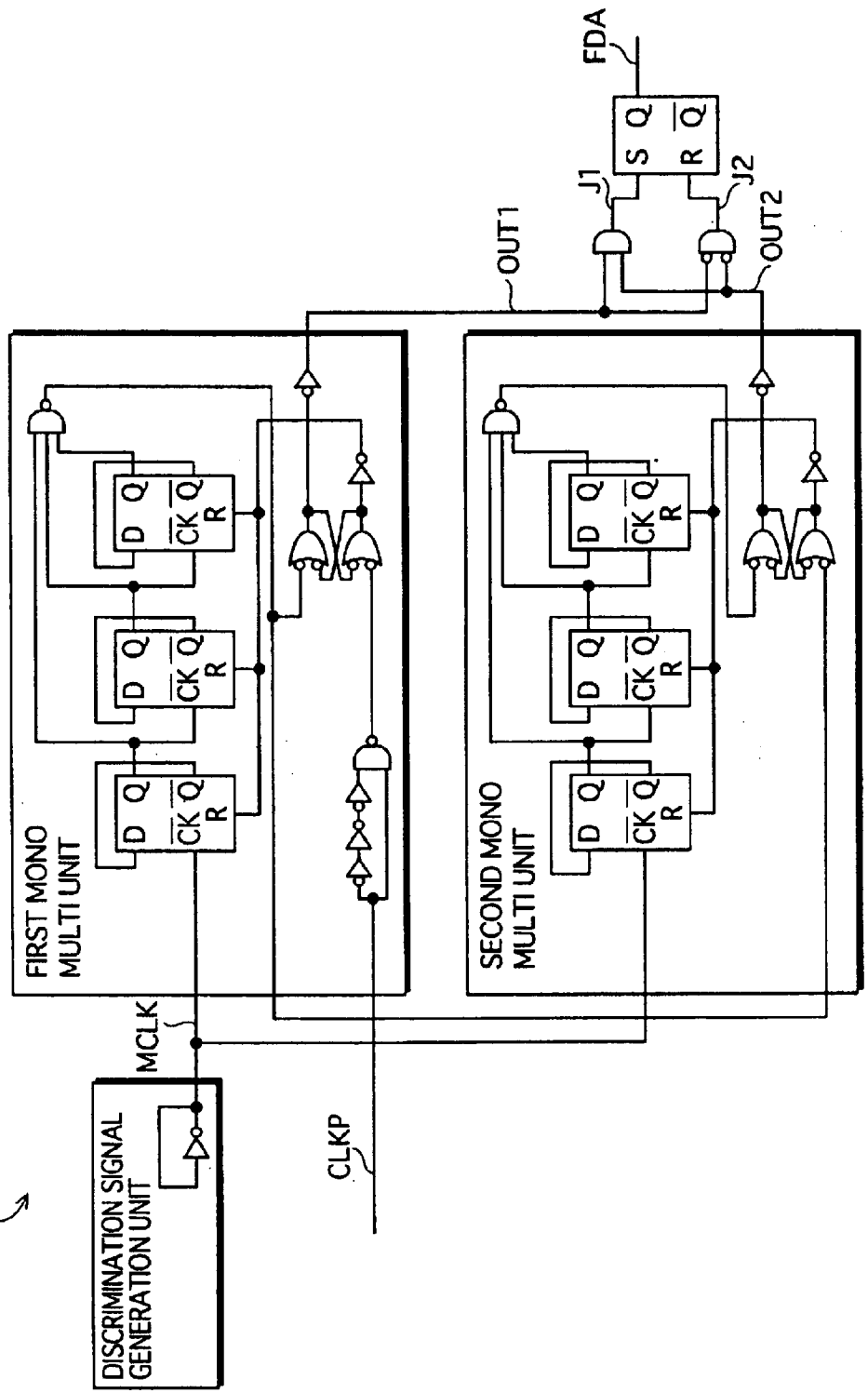
FIG. 9 is a functional block diagram showing a construction of a pulse frequency discrimination unit shown in FIG. 8.

FIG. 9 is a functional block diagram showing a construction of the pulse frequency discrimination unit 22.

A discrimination signal generation unit generates discrimination signal MCLK.

A first mono multi unit is a monostable multivibrator which is constructed using a digital circuit. The first mono multi unit is triggered in sync with clock signal CLKP, and outputs output signal OUT1 for a period of eight pulses of discrimination signal MCLK.

A second mono multi unit is a monostable multivibrator which is constructed using a digital circuit. The second mono multi unit is triggered when the output of output signal OUT1 ends, and outputs output signal OUT2 for a period of eight pulses of discrimination signal MCLK.

Signal J1 indicates that both OUT1 and OUT2 are being output, whereas signal J2 indicates that neither OUT1 nor OUT2 is being output. Signals J1 and J2 are input respectively to S and R inputs of a flip flop.

The pulse frequency discrimination unit 22 discriminates the pulse frequency of clock signal CLKP (i.e., whether clock signal CLKP has a short cycle or a long cycle), depending on whether the output of next OUT1 begins during or after the output of OUT2.

(Operation of the Pulse Frequency Discrimination Unit 22)

Figure 10:
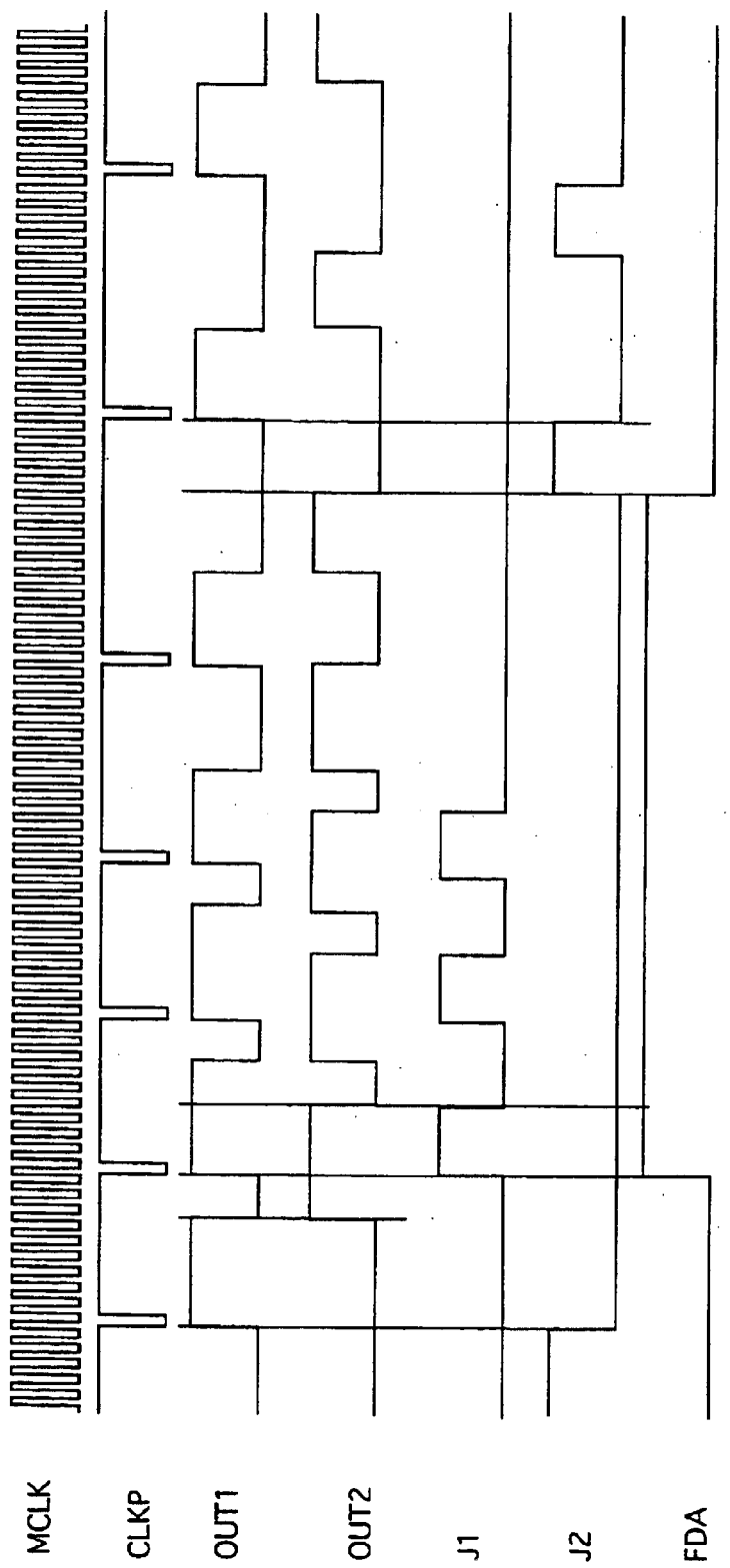
FIG. 10 is a waveform chart showing temporal changes of main signals in the pulse frequency discrimination unit.

FIG. 10 is a waveform chart showing temporal changes of main signals in the pulse frequency discrimination unit 22.

The left half of FIG. 10 shows a case when the pulse frequency of clock signal CLKP is high (i.e. clock signal CLKP has a short cycle). In this case, the output of next OUT1 begins during the output of OUT2. Accordingly, signal J1 is output in each cycle of clock signal CLKP, whilst signal J2 is not output. This repeatedly sets the flip-flop, as a result of which step frequency signal FDA is held high.

The right half of FIG. 10 shows a case when the pulse frequency of clock signal CLKP is low (i.e. clock signal CLKP has a long cycle). In this case, the output of next OUT1 begins after the output of OUT2. Accordingly, signal J1 is not output, whilst signal J2 is output in each cycle of clock signal CLKP. This repeatedly resets the flip-flop, as a result of which step frequency signal FDA is held low.

Third Embodiment

A stepping motor drive device of the third embodiment of the present invention differs from that of the second embodiment in the construction relating to the generation of reference signal VCTA. The following explanation mainly focuses on this difference from the second embodiment.

(Construction Relating to the Generation of Reference Signal VCTA)

Figure 11:
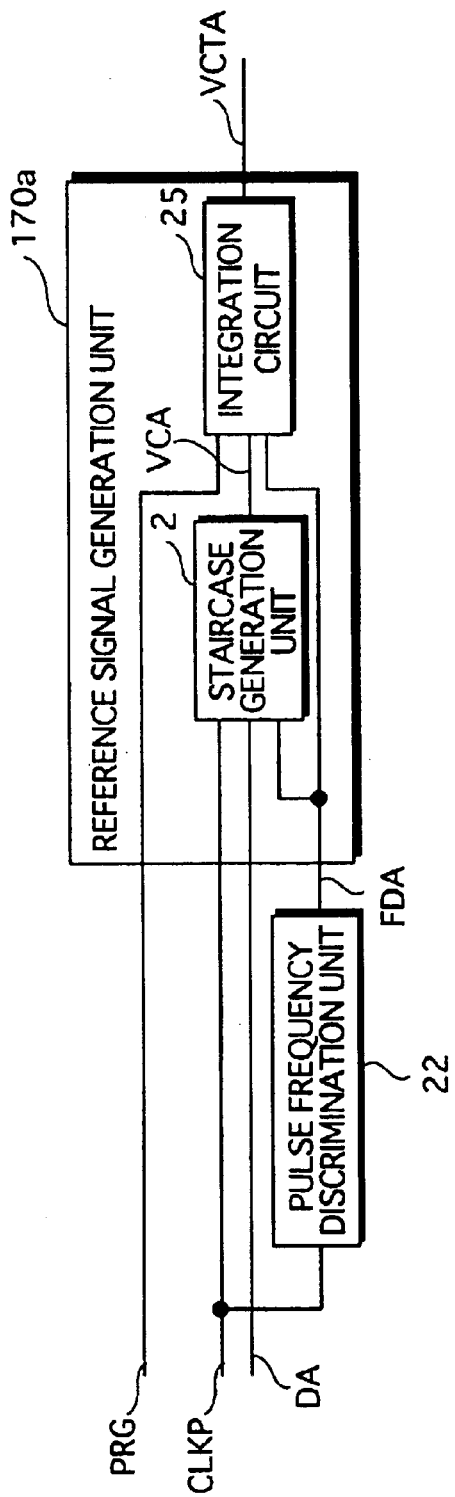
FIG. 11 is a functional block diagram showing another modification relating to reference signal generation.

FIG. 11 is a functional block diagram showing a construction relating to the generation of reference signal VCTA in the third embodiment. This construction is different from that of the second embodiment in that an integration circuit 25 is included instead of the integration circuit 3.

(Integration Circuit 25)

Figure 12:
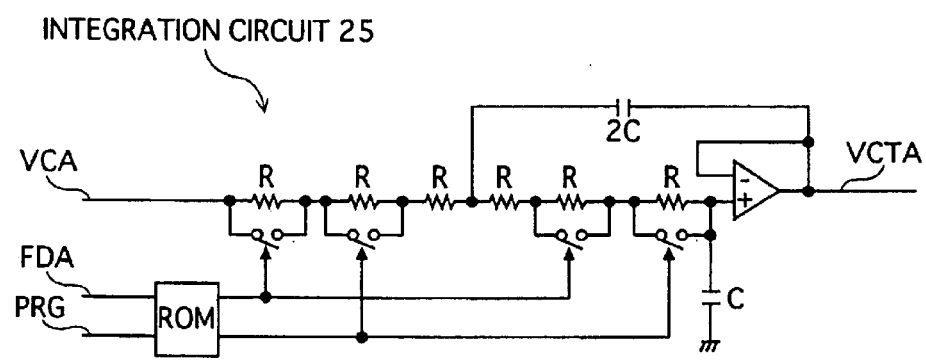
FIG. 12 is a functional block diagram showing a construction of an integration circuit shown in FIG. 11.

FIG. 12 is a functional block diagram showing a detailed construction of the integration circuit 25. In the integration circuit 25, switches under control of both step frequency signal FDA and program signal PRG are provided to adjust a resistance for determining an integration time constant.

A ROM prestores, for each of a plurality of integration time constants, information showing a short-circuit/open-circuit state of each switch for obtaining the integration time constant. The integration circuit 25 reads information showing a short-circuit/open-circuit state of each switch from the ROM, in accordance with step frequency signal FDA and program signal PRG. The integration circuit 25 then outputs a signal indicating the short-circuit/open-circuit state shown by the read information, to the corresponding switch.

Thus, the integration circuit 25 sets the integration time constant for obtaining reference signal VCTA which follows the average gradient of staircase signal VCA, according to a rapidity of change in level of staircase signal VCA. This rapidity of change in level of staircase signal VCA is defined by the step frequency of staircase signal VCA designated by step frequency signal FDA and also by an additional parameter, such as the step height of staircase signal VCA, designated by program signal PRG.

Fourth Embodiment

A stepping motor drive device of the fourth embodiment of the present invention differs from that of the first embodiment in that the energization logic unit performs synchronous rectification control. Synchronous rectification control is a control in which the transistors 10 and 12 are brought into conduction in the regenerative period to have the current of the first coil 19a flow back through the transistors 10 and 12. The following explanation mainly focuses on this difference from the first embodiment.

(Energization Logic Unit 46)

Figure 13:
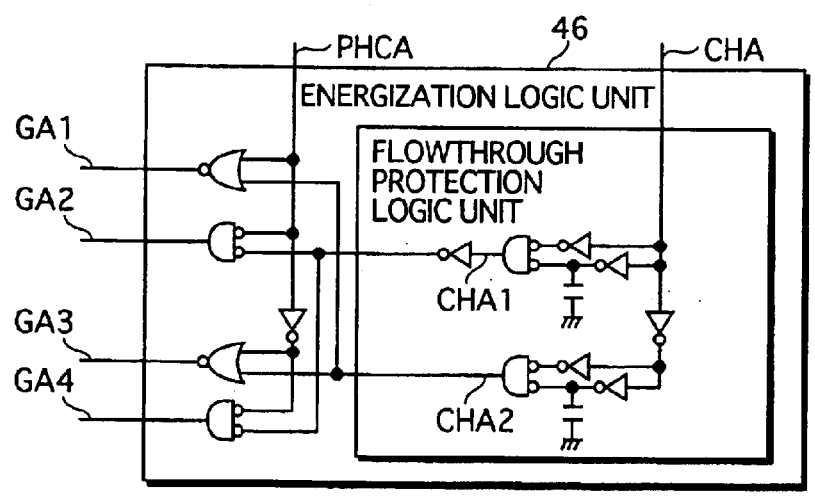
FIG. 13 is a functional block diagram showing a construction of an energization logic unit having a synchronous rectification control function.

FIG. 13 is a functional block diagram showing a detailed construction of an energization logic unit 46 having a synchronous rectification control function.

A flowthrough protection logic unit generates signal CHA1 showing a shortened supply period and signal CHA2 showing a shortened regenerative period. Gate signals GA1–GA4 are output according to signals CHA1 and CHA2 and polarity signal PHCA.

Here, gate signals GA1 and GA3 are negative logic signals, whereas gate signals GA2 and GA4 are positive logic signals. When a negative logic signal is low, a corresponding transistor conducts. Meanwhile, when a positive logic signal is high, a corresponding transistor conducts.

Figure 14:
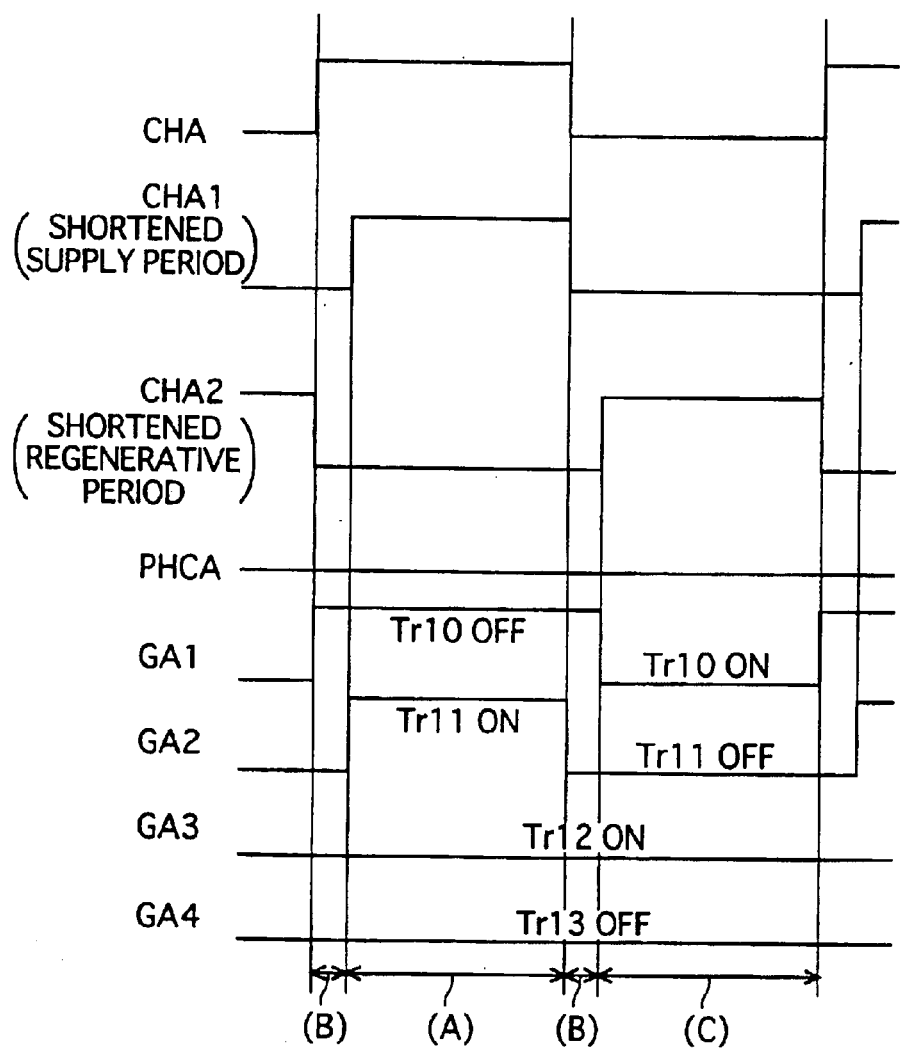
FIG. 14 is a waveform chart showing temporal changes of main signals in the energization logic unit shown in FIG. 13.

FIG. 14 is a waveform chart showing temporal changes of main signals in the energization logic unit 46. The drawing shows an example when polarity signal PHCA is low.

One cycle of supply instruction signal CHA is made up of (A) the shortened supply period, (B) a flowthrough protection period, and (C) the shortened regenerative period, in accordance with a combination of levels of signals CHA1 and CHA2.

When polarity signal PHCA is low, gate signal GA1 is low only during the shortened regenerative period (i.e. the transistor 10 conducts only during the shortened regenerative period), and gate signal GA2 is high only during the shortened supply period (i.e. the transistor 11 conducts only during the shortened supply period). Meanwhile, gate signal GA3 is constantly low (i.e. the transistor 12 conducts constantly), and gate signal GA4 is constantly low (i.e. the transistor 13 is cut off constantly).

Figure 15A:
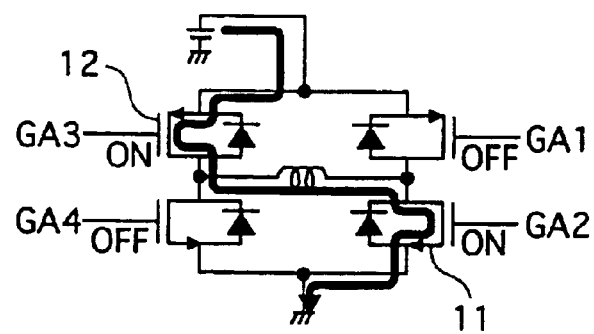
FIGS. 15A to 15C are conceptual diagrams showing current passages formed under control of the energization logic unit.
Figure 15B:
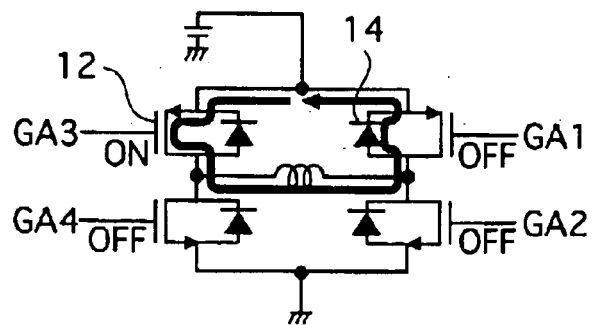
Figure 15C:
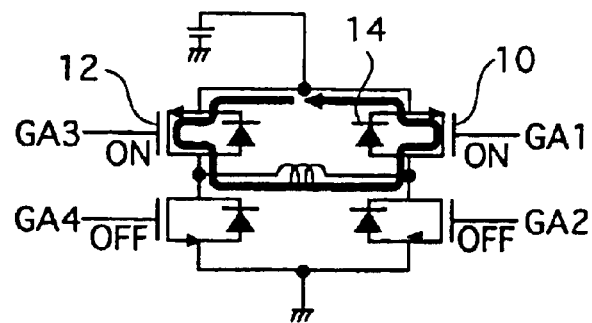

FIGS. 15A–15C are conceptual diagrams showing a current path in each of the shortened supply period, the flowthrough protection period, and the shortened regenerative period.

In the shortened supply period, a current is supplied to the first coil 19a along a current path shown in FIG. 15A.

In the flowthrough protection period, the current of the first coil 19a flows back through an ON resistance of the transistor 12 and an ON resistance of the flywheel diode 14, along a current path shown in FIG. 15B.

In the shortened regenerative period, the current of the first coil 19a flows back through the ON resistance of the transistor 12 and an ON resistance of the transistor 10, along a current path shown in FIG. 15C.

In general, an ON resistance of a transistor is smaller than an ON resistance of a diode. Accordingly, the coil current decays quickly if it flows backward through the ON resistance of the transistor 10.

This enables the coil current to more promptly approach the current limit value shown by reference signal VCTA when reference signal VCTA decreases, than in the first embodiment where the current path shown in FIG. 15B is formed in the regenerative period.

Furthermore, the above flowthrough protection period prevents the transistors 10 and 11 from conducting at the same time and thereby causing the power supply 8 to short-circuit.

When polarity signal PHCA is high, the same operation as above is carried out with the left and right halves of the circuit diagram of each of FIGS. 15A–15C being reversed.

Fifth Embodiment

A stepping motor drive device of the fifth embodiment of the present invention differs from that of the first embodiment in that the supply current is measured using a transistor included in the bridge rectification circuit. The following explanation mainly focuses on this difference from the first embodiment.

(Overall Construction)

Figure 16:
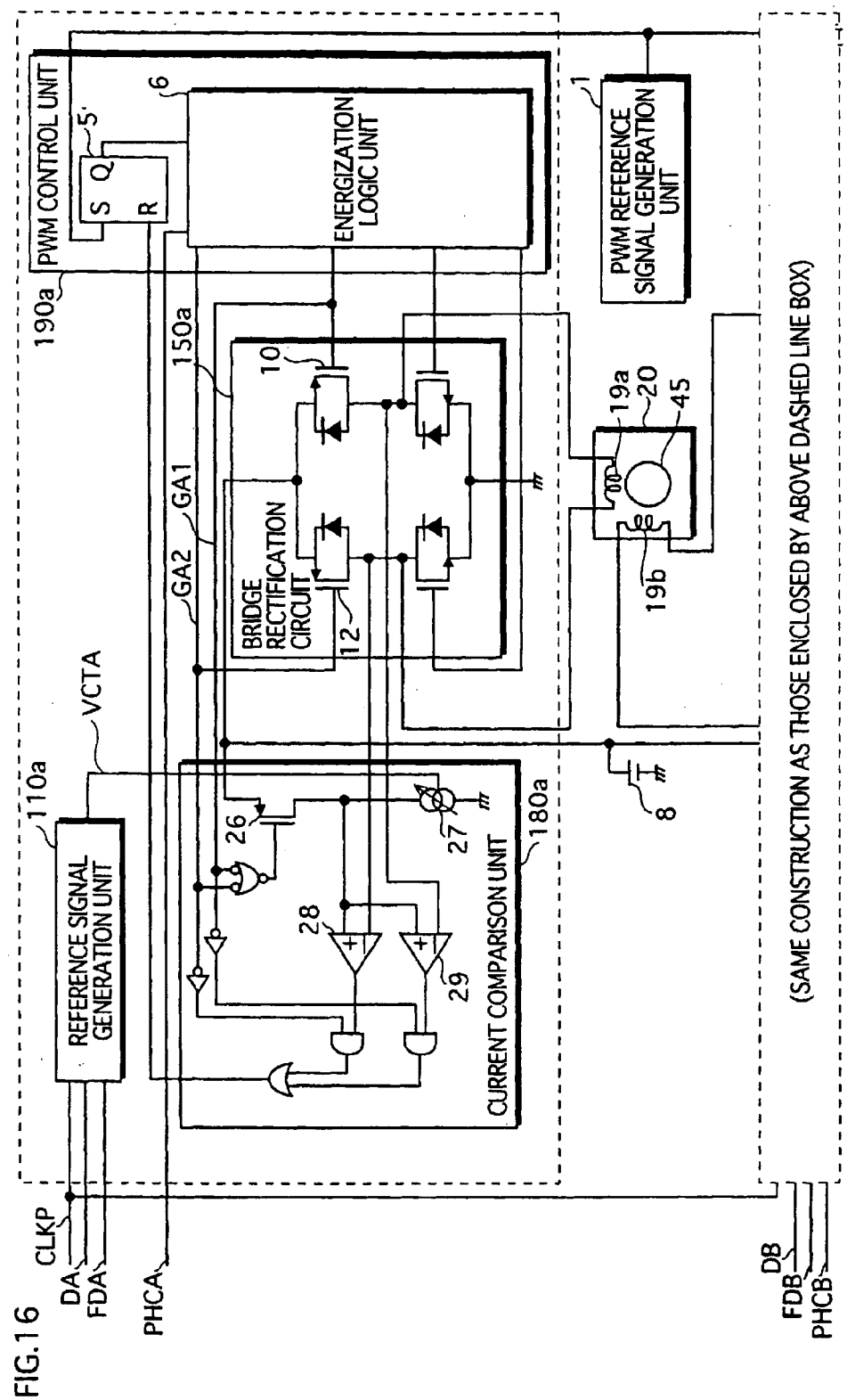
FIG. 16 is a functional block diagram showing a modification relating to supply current measurement.

FIG. 16 is a functional block diagram showing an overall construction of the stepping motor drive device of the fifth embodiment. The drawing also shows a stepping motor driven by the stepping motor drive device.

Components that are the same as those in the first embodiment have been given the same reference numerals and their explanation has been omitted. Also, since the same components are provided for each of the first coil 19a and the second coil 19b, the components provided for the first coil 19a are explained below as a representative example.

The stepping motor drive device includes the PWM reference signal generation unit 1, the reference signal generation unit 110a, abridge rectification circuit 150a, a current comparison unit 180a, a PWM control unit 190a, and the power supply 8.

The bridge rectification circuit 150a is different from the bridge rectification circuit 130a in that drain voltages of the transistors 10 and 12 are output to outside of the bridge rectification circuit 150a.

The current comparison unit 180a includes a transistor 26, a reference current source 27, comparators 28 and 29, and a logic gate group for controlling the transistor 26 and for selecting a comparison result of one of the comparators 28 and 29.

The PWM control unit 190a is different from the PWM control unit 120a in that the comparator 4 is omitted and the flip-flop 5 is externally resettable.

(PWM Control of a Coil Current)

In the supply period, a current of a polarity corresponding to polarity signal PHCA is supplied to the first coil 19a. This supply current increases gradually. During this time, the transistor 26 conducts according to an OR signal of gate signals GA1 and GA2. The reference current source 27 generates a reference current corresponding to reference signal VCTA. The transistor 26 has a drain voltage corresponding to this reference current.

The comparator 28 compares the drain voltage of the transistor 26 with the drain voltage of the transistor 12. The comparator 29 compares the drain voltage of the transistor 26 with the drain voltage of the transistor 10.

As the supply current increases, the drain voltage of one of the transistors 10 and 12 that is conducting decreases. When the drain voltage of the conducting transistor 10 or 12 falls below the drain voltage of the transistor 26 (i.e. when the supply current rises above the current limit value shown by reference signal VCTA), the comparator 29 or 28 generates an output signal. This output signal resets the flip-flop 5 in the PWM control unit 190a via the logic gate group. This causes the current supply to the first coil 19a to stop.

In the regenerative period, the same operation as in the first embodiment is carried out.

The above supply period and regenerative period are repeated each time the PWM reference signal is output. In this way, the coil current of the first coil 19a is controlled to approach the current limit value shown by reference signal VCTA, as in the first embodiment.

Sixth Embodiment

A stepping motor drive device of the sixth embodiment of the present invention differs from those of the first and second embodiments in the following point. Serial data showing a level of each step of a staircase is received. Staircase signal VCA is generated based on the serial data, and reference signal VCTA is generated based on staircase signal VCA. The following explanation mainly focuses on this difference from the first and second embodiments.

(Overall Construction)

Figure 17:
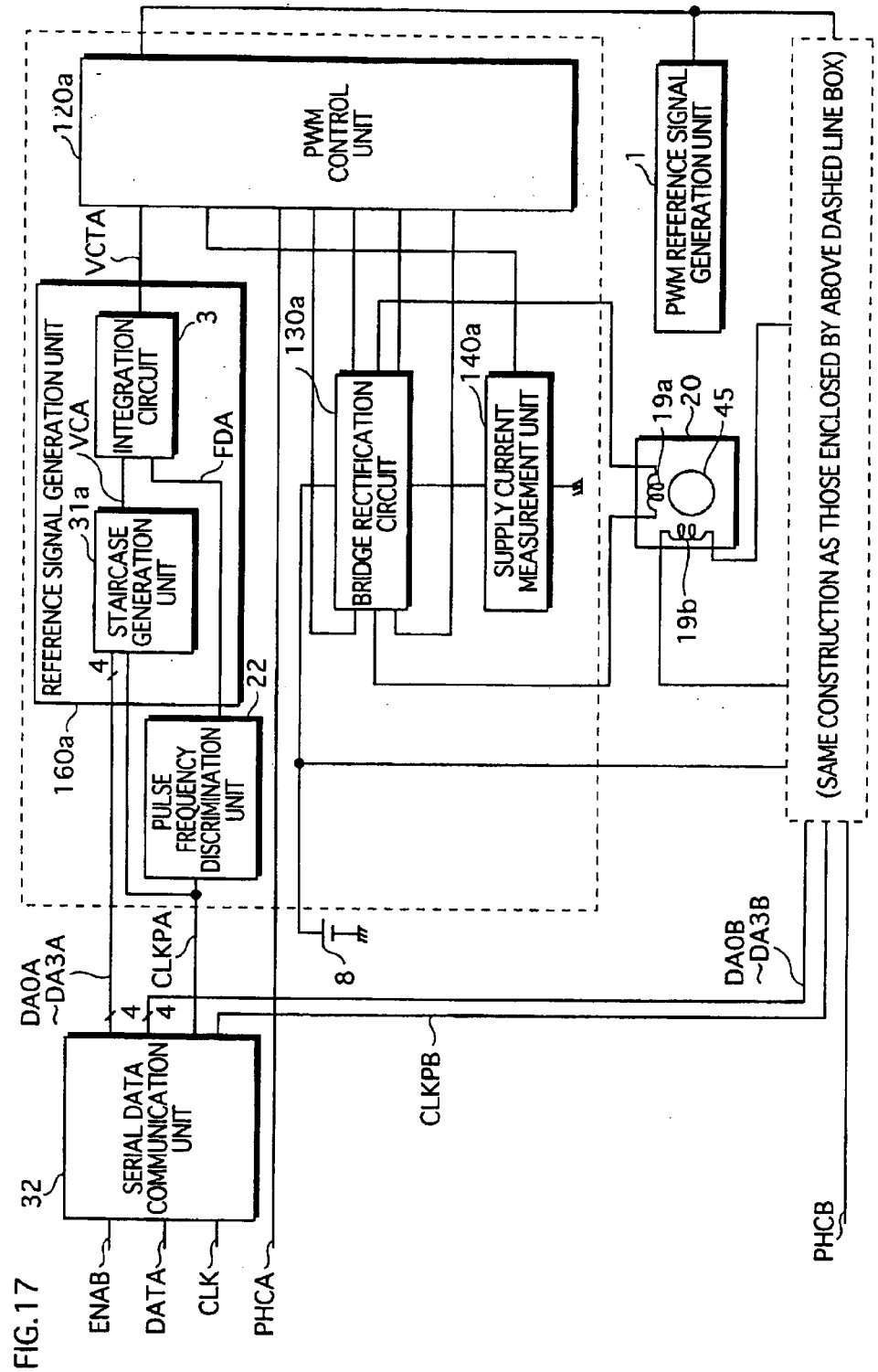
FIG. 17 is a functional block diagram showing a modification relating to staircase generation.

FIG. 17 is a functional block diagram showing an overall construction of the stepping motor drive device of the sixth embodiment.

Components which are the same as those in the first and second embodiments have been given the same reference numerals and their explanation has been omitted. Also, since the same components are provided for each of the first coil 19a and the second coil 19b, the components provided for the first coil 19a are explained below as a representative example.

The stepping motor drive device includes the PWM reference signal generation unit 1, a serial data communication unit 32, the pulse frequency discrimination unit 22, a reference signal generation unit 160a, the PWM control unit 120a, the bridge rectification circuit 130a, the supply current measurement unit 140a, and the power supply 8.

The serial data communication unit 32 receives, for each of the first coil 19a and the second coil 19b (the first coil 19a in this example), serial information signal DATA showing a level of each step of a staircase, in accordance with communication control signals ENAB and CLK. The serial data communication unit 32 converts information signal DATA to parallel data, and outputs parallel data DA0A–DA3A to the reference signal generation unit 160a together with clock signal CLKPA in units of steps.

A staircase generation unit 31a in the reference signal generation unit 160a is different from the staircase generation unit 2 in that the step frequency switch unit and the up-down counter are omitted. In other words, the staircase generation unit 31a is substantially a D/A converter. The staircase generation unit 31a digital-to-analog converts the parallel data showing the level of each step, in units of steps. Hence staircase signal VCA is generated.

(Serial Data)

Figure 18:
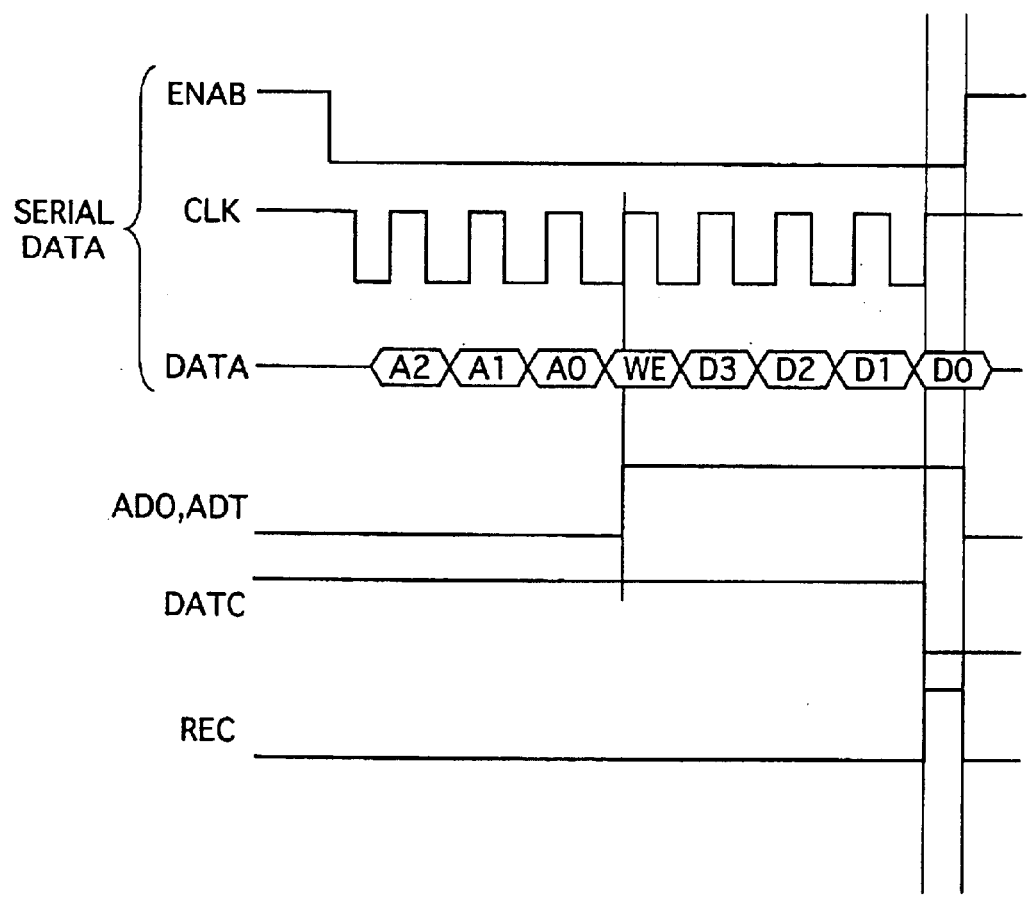
FIG. 18 is a waveform chart showing temporal changes of received serial data and main signals in a serial data communication unit shown in FIG. 17.

FIG. 18 is a timing chart showing one unit of serial data corresponding to one step of a staircase. The serial data communication unit 32 receives such serial data for a plurality of steps in sequence. In FIG. 18, ENAB is a unit time signal, CLK is a bit synchronization signal, and DATA is an information signal.

One unit of information signal DATA is made up of 8 bits. The first 3 bits are address A2–A0 for identifying a coil, the next bit is write enable bit WE (WE is fixed at 0 to constantly permit writes in this embodiment), and the remaining 4 bits are data D3–D0 showing a step level.

Note that FIG. 18 also shows temporal changes of main signals in the serial data communication unit 32.

(Serial Data Communication Unit 32)

Figure 19:
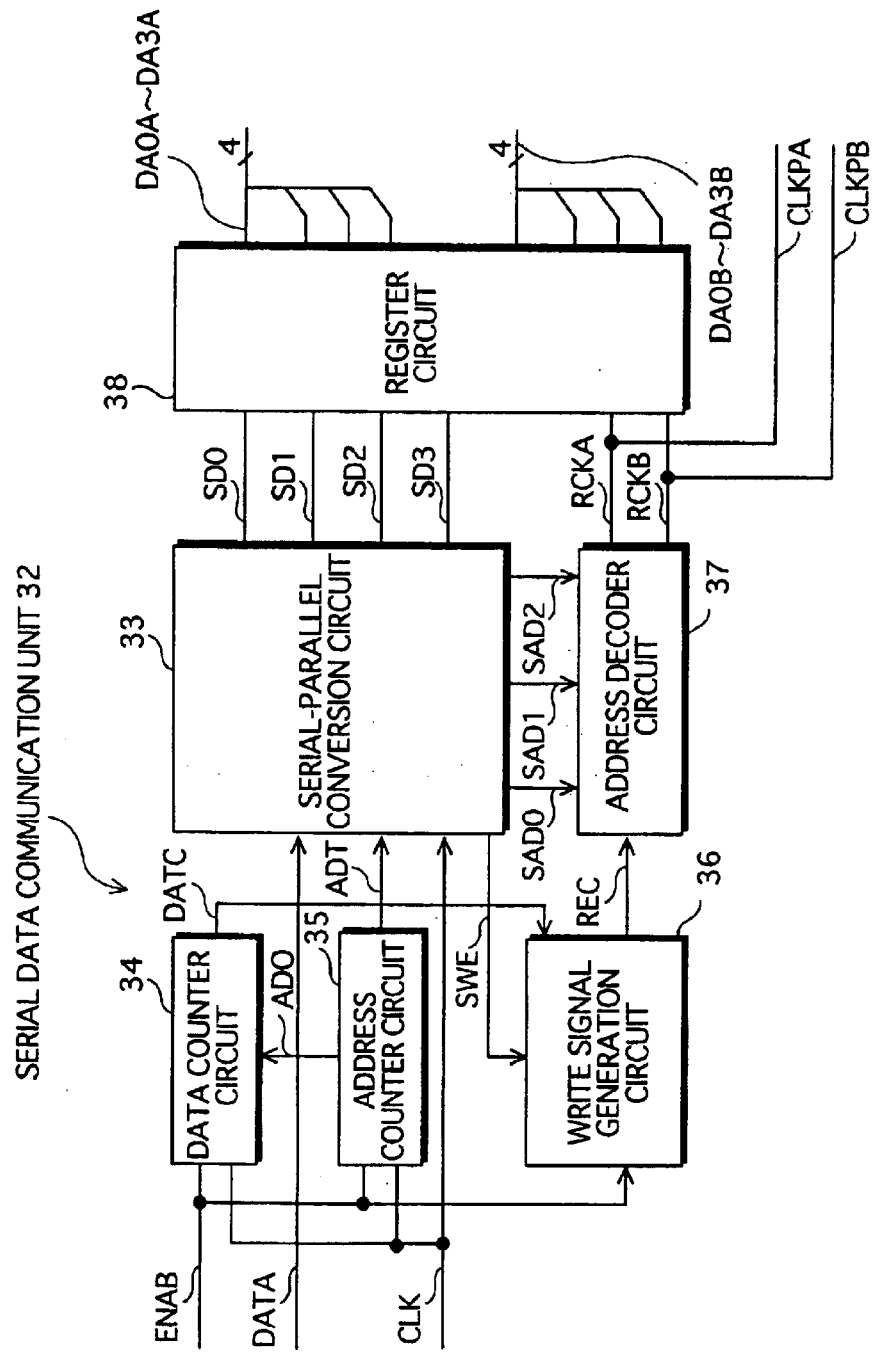
FIG. 19 is a functional block diagram showing a construction of the serial data communication unit.

FIG. 19 is a functional block diagram showing a detailed construction of the serial data communication unit 32. The serial data communication unit 32 includes an address counter circuit 35, a data counter circuit 34, a serial-parallel conversion circuit 33, a write signal generation circuit 36, an address decoder circuit 37, and a register circuit 38.

Figure 20:
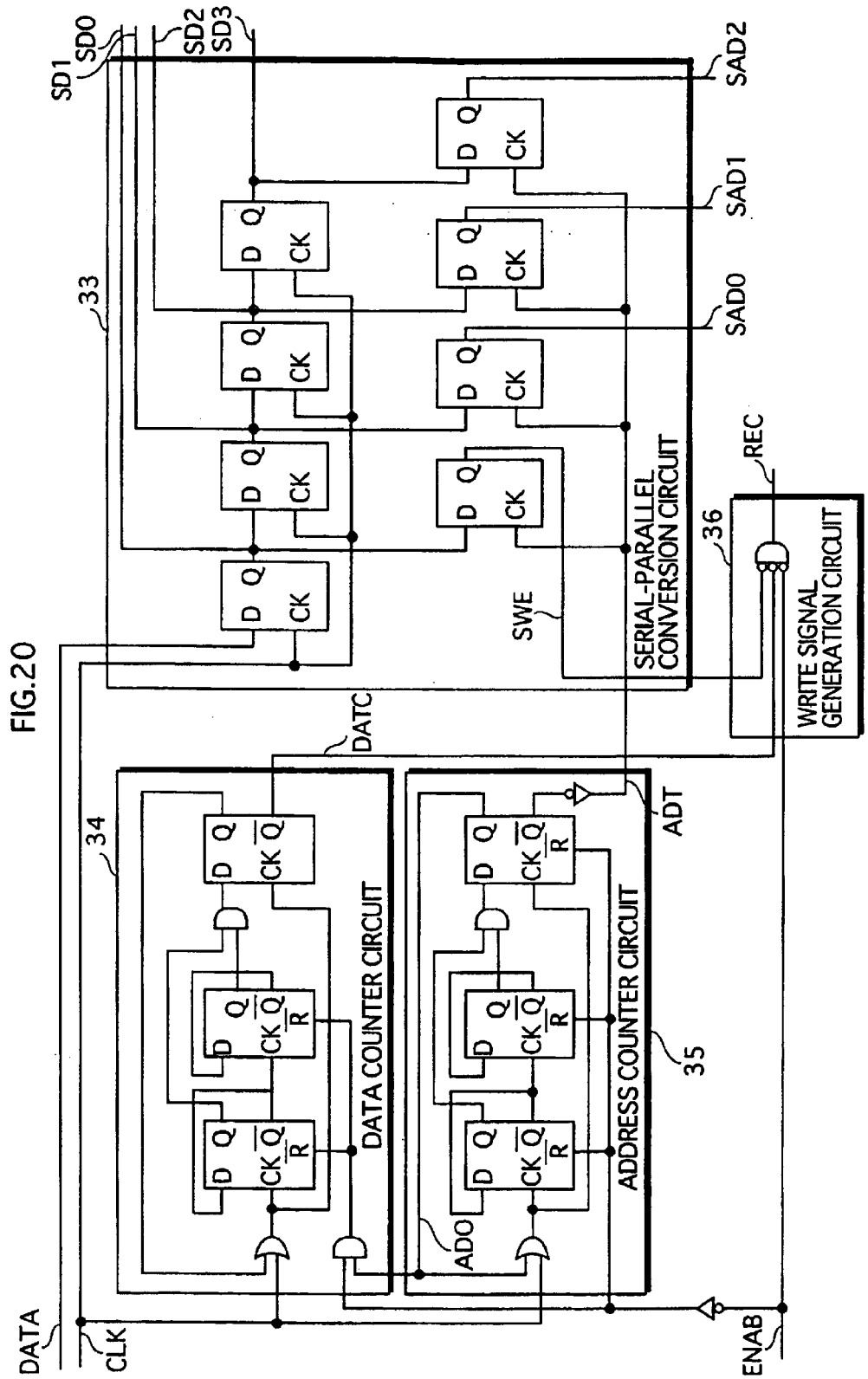
FIG. 20 is a functional block diagram showing constructions of an address counter circuit, a data counter circuit, a serial-parallel conversion circuit, and a write signal generation circuit shown in FIG. 19.

FIG. 20 is a functional block diagram showing detailed constructions of the address counter circuit 35, the data counter circuit 34, the serial-parallel conversion circuit 33, and the write signal generation circuit 36.

The address counter circuit 35 counts bit synchronization signal CLK for the first 4 bits of one unit of serial data, and outputs address completion signals ADO and ADT indicating that the reception of the first 4 bits of information signal DATA has completed.

The data counter circuit 34 is triggered by address completion signal ADO, and counts bit synchronization signal CLK for the latter 4 bits of the serial data. The data counter circuit 34 then outputs data completion signal DATC indicating that the reception of all 8 bits of information signal DATA has completed.

The serial-parallel conversion circuit 33 converts information signal DATA to parallel data, using a shift register which is made up of four flip-flops shown in the upper part of FIG. 20. The serial-parallel conversion circuit 33 then latches address SAD0–SAD2 and write enable bit WE which constitute the first 4 bits into four flip-flops shown in the lower part of FIG. 20, with the leading edge of address completion signal ADT. As a result, address SAD0–SAD2 and write enable bit WE are separated from data SD0–SD3 which constitute the latter 4 bits.

The write signal generation circuit 36 outputs write signal REC, when both data completion signal DATC and unit time signal ENAB are being output.

Figure 21:
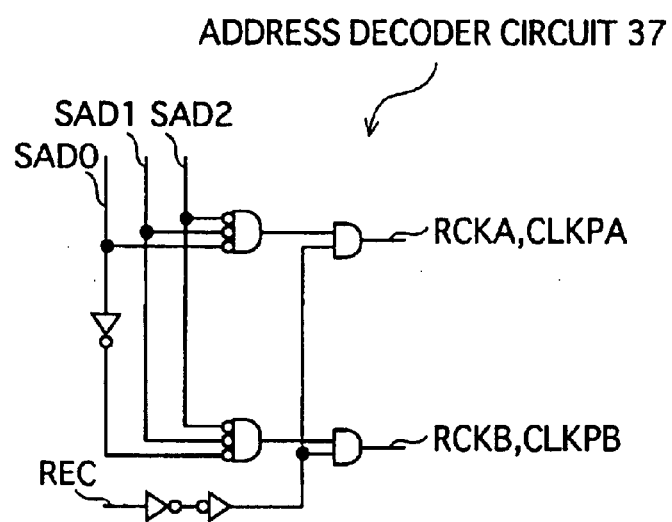
FIG. 21 is a functional block diagram showing a construction of an address decoder circuit shown in FIG. 19.

FIG. 21 is a functional block diagram showing a detailed construction of the address decoder circuit 37.

The address decoder circuit 37 generates signal RCKA or RCKB which instructs to store data SD0–SD3 in a 4-bit register group provided for a corresponding coil in the register circuit 38, in accordance with write signal REC and address SAD0–SAD2. Signal RCKA or RCKB is also used as signal CLKPA or CLKPB that shows a unit time corresponding to each step for the corresponding coil.

Figure 22:
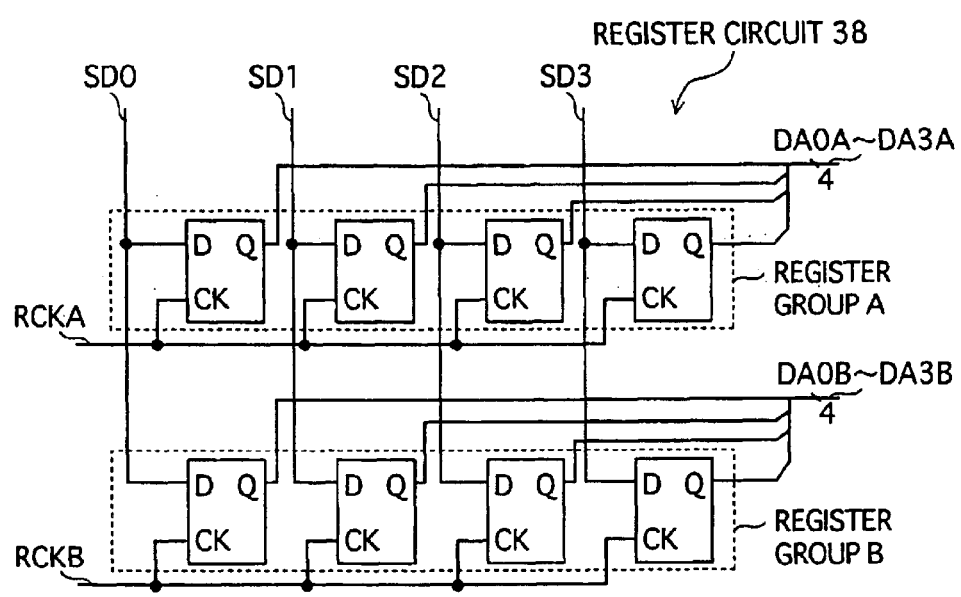
FIG. 22 is a functional block diagram showing a construction of a register circuit shown in FIG. 19.

FIG. 22 is a functional block diagram showing a detailed construction of the register circuit 38.

The register circuit 38 has 4-bit register groups A and B respectively for the first coil 19a and the second coil 19b. Upon receiving signal RCKA from the address decoder circuit 37, the register circuit 38 stores data SD0–SD3 to the register group A, and outputs the stored data as 4-bit parallel signal DA0A–DA3A. Upon receiving signal RCKB from the address decoder circuit 37, on the other hand, the register circuit 38 stores data SD0–SD3 to the register group B, and outputs the stored data as 4-bit parallel signal DA0B–DA3B.

(Staircase Generation Unit 31a)

The staircase generation unit 31a is substantially a D/A converter, as noted earlier. The staircase generation unit 31a digital-to-analog converts parallel data DA0A–DA3A in units of steps shown by clock signal CLKPA, to generate staircase signal VCA.

According to this embodiment, the level of each step of staircase signal VCA is designated by serial data. This makes it possible to form not only staircase signal VCA of a trapezoidal waveform used in the first embodiment but also staircase signal VCA of a desired waveform. For example, if serial data is generated by sampling a sinusoidal wave, a near-sinusoidal staircase waveform can be obtained.

Other Modifications

The present invention has been described by way of the above embodiments, though it should be obvious that the invention is not limited to the above. Example modifications are given below.

(1) The stepping motor drive methods of the invention described in the above embodiments may be realized by a computer program that is executed by a computer system. Such a computer program may be distributed as a digital signal.

The invention may also be realized by a computer-readable storage medium, such as a flexible disk, a hard disk, a CD, an MO (Magneto-Optical) disc, a DVD (Digital Versatile Disc), or a semiconductor memory, on which the computer program or digital signal mentioned above is recorded.

The computer program or digital signal that achieves the invention may also be transmitted via a network, such as an electronic communications network, a wired or wireless communications network, or the Internet.

The computer program or digital signal may be provided to an independent computer system by distributing a storage medium on which the computer program or digital signal is recorded, or by transmitting the computer program or digital signal via a network. The independent computer system may then execute the computer program or digital signal to function as the invention.

(2) The above embodiments describe the case where the transistors 11 and 13 are used to perform chopping control on the coil current. However, the same vibration and noise suppression effect can still be achieved even when the transistors 10 and 12 are used for chopping control.

(3) The above embodiments describe an example when the invention is used for a 2-phase stepping motor, but this is not a limit for the invention, which may be equally used for a stepping motor having a different number of phases. For instance, the invention can be used to control the current supply to each coil of a 5-phase stepping motor using a reference signal of a waveform which has no abrupt changes in level.

(4) The above embodiments describe the case where the reference signal generation unit includes the staircase generation unit for generating a staircase signal and the integration circuit for integrating the staircase signal to generate a reference signal of a waveform which has no abrupt changes in level. However, the reference signal generation unit may have a different construction. For example, the reference signal generation unit may generate a reference signal of a waveform which has no abrupt changes in level, through the use of an analog oscillation circuit.

Figure 23:
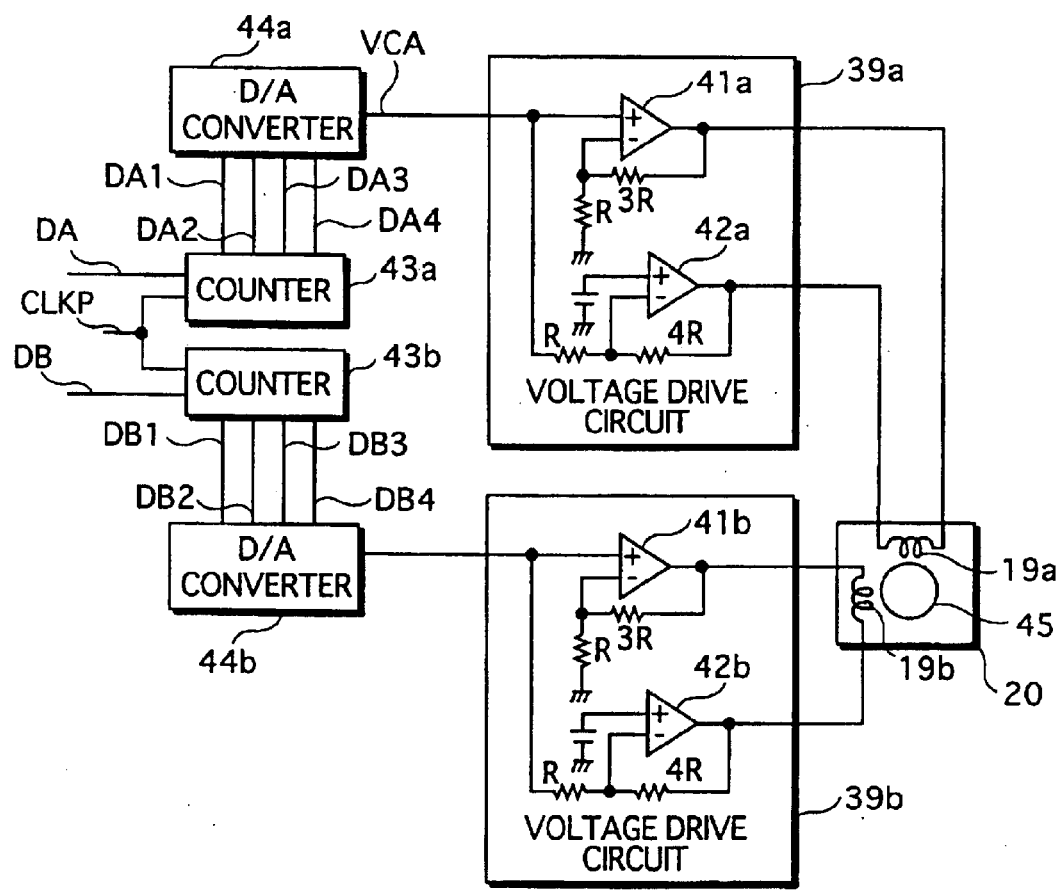
FIG. 23 is a functional block diagram showing a construction of a conventional stepping motor drive device.

(5) The stepping motor drive device of the invention may drive each coil through the application of a voltage, according to a reference signal of a waveform which has no abrupt changes in level. A fundamental construction for driving each coil through the application of a voltage is shown in FIG. 23. This construction shown in FIG. 23 and the construction of the reference signal generation unit of the invention may be combined to drive each coil through the application of a voltage, using reference signal VCTA of a waveform which has no abrupt changes in level instead of using staircase signal VCA.

Although the present invention has been fully described by way of examples with reference to the accompanying drawings, it is to be noted that various changes and modifications will be apparent to those skilled in the art.

Therefore, unless such changes and modifications depart from the scope of the present invention, they should be construed as being included therein.

What is claimed is:

1. A stepping motor drive device comprising:
   a supply current measurement unit operable to measure a supply current to a coil included in a stepping motor;
   a reference signal generation unit operable to generate a reference signal of a waveform which has no abrupt changes in level, the reference signal showing a target value for the supply current;
   a chopper switching circuit operable to pass the supply current to the coil in a conducting state, and stop the supply current to the coil in a nonconducting state; and
   a pulse width modulation control unit operable to (a) put the chopper switching circuit in the conducting state at predetermined time intervals, and (b) when in each time interval the supply current measured by the supply current measurement unit rises above the target value shown by the reference signal, put the chopper switching circuit in the nonconducting state.

2. The stepping motor drive device of claim 1,
wherein the reference signal generation unit includes:
a staircase generation unit operable to generate a staircase signal; and
an integration circuit operable to generate the reference signal by integrating the staircase signal.

3. The stepping motor drive device of claim 2,
wherein the integration circuit generates the reference signal which follows an average gradient of the staircase signal, by integrating the staircase signal using a time constant corresponding to a rapidity of change in level of the staircase signal.

4. The stepping motor drive device of claim 3,
wherein the integration circuit acquires a rapidity signal showing the rapidity of change in level of the staircase signal, and determines the time constant according to the rapidity signal.

5. The stepping motor drive device of claim 3,
wherein the staircase generation unit generates the staircase signal by counting a pulse signal which has one pulse per step of the staircase signal,
the stepping motor drive device further comprises:
a discrimination unit operable to discriminate a pulse frequency of the pulse signal, and
the integration circuit determines the time constant based on a result of the discrimination by the discrimination unit.

6. The stepping motor drive device of claim 2 further comprising:
an information signal reception unit operable to receive an information signal showing a level of each step of the staircase signal,
wherein the staircase generation unit generates the staircase signal, by digital-to-analog converting the received information signal in a unit of time corresponding to each step.

7. The stepping motor drive device of claim 1 further comprising:
a bridge rectification circuit including the chopper switching circuit and a plurality of switching circuit, and operable to rectify the supply current,
wherein the pulse width modulation control unit reverses a polarity of the supply current, by putting each of the chopper switching circuit and the plurality of switching circuits individually in a predetermined state that is one of the conducting state and the nonconducting state.

8. The stepping motor drive device of claim 7 further comprising:
a synchronous rectification control unit operable to put at least two out of the plurality of switching circuits in the conducting state during a period when the chopper switching circuit is in the nonconducting state, to have a current in the coil flow back through the at least two switching circuits.

9. The stepping motor drive device of claim 7,
wherein the supply current measurement unit is realized by one out of the chopper switching circuit and the plurality of switching circuits that is in the conducting state, and measures the supply current using a voltage drop caused by an ON resistance of the switching circuit in the conducting state,
the stepping motor drive device further comprises:
a reference current source operable to generate a current having the target value shown by the reference signal; and
a resistor connected in series with the reference current source, and the pulse width modulation control unit puts the chopper switching circuit in the conducting state at the predetermined time intervals, and when in each time interval the voltage drop of the supply current measurement unit exceeds a voltage drop of the resistor, puts the chopper switching circuit in the nonconducting state.

10. The stepping motor drive device of claim 9,
wherein the resistor is a semiconductor element in the conducting state.

11. The stepping motor drive device of claim 1,
wherein the supply current measurement unit includes a resistor connected in series with the coil, and measures the supply current using a voltage drop of the resistor.

12. The stepping motor drive device of claim 11,
wherein the resister is a semiconductor element in the conducting state.

13. The stepping motor drive device of claim 1,
wherein the stepping motor has a plurality of coils which correspond one-to-one with a plurality of phases,
the supply current measurement unit measures the supply current for each of the plurality of coils,
the reference signal generation unit generates the reference signal for each of the plurality of coils,
the chopper switching circuit, for each of the plurality of coils, passes the supply current to the coil in the conducting state and stops the supply current to the coil in the nonconducting state, and
the pulse width modulation control unit, for each of the plurality of coils, puts the chopper switching circuit in the conducting state at the predetermined time intervals, and when in each time interval the supply current measured by the supply current measurement unit rises above the target value shown by the reference signal, puts the chopper switching circuit in the nonconducting state.

14. A stepping motor drive method comprising:
a supply current measurement step of measuring a supply current to a coil included in a stepping motor;
a reference signal generation step of generating a reference signal of a waveform which has no abrupt changes in level, the reference signal showing a target value for the supply current; and
a pulse width modulation control step of (a) putting a chopper switching circuit which passes the supply current to the coil in a conducting state and stops the supply current to the coil in a nonconducting state, in the conducting state at predetermined time intervals, and (b) when in each time interval the supply current measured in the supply current measurement step rises above the target value shown by the reference signal, putting the chopper switching circuit in the nonconducting state.

15. The stepping motor drive method of claim 14,
wherein the reference signal generation step includes:
a staircase generation step of generating a staircase signal; and
an integration step of generating the reference signal by integrating the staircase signal.

16. The stepping motor drive method of claim 15,
wherein the integration step generates the reference signal which follows an average gradient of the staircase signal, by integrating the staircase signal using a time constant corresponding to a rapidity of change in level of the staircase signal.

* * * * *